(12) United States Patent
Yu et al.

(10) Patent No.: US 6,180,543 B1
(45) Date of Patent: Jan. 30, 2001

(54) METHOD OF GENERATING TWO NITROGEN CONCENTRATION PEAK PROFILES IN GATE OXIDE

(75) Inventors: Mo-Chiun Yu, Taipei; Syun-Ming Jang, Hsin-Chu, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/347,910

(22) Filed: Jul. 6, 1999

(51) Int. Cl.[7] ................................................... H01L 21/31
(52) U.S. Cl. ............................................ 438/787; 438/787
(58) Field of Search ........................................ 438/287, 305, 438/307, 308, 769, 770, 775, 787, 439, 762, 981, 591

(56) References Cited

U.S. PATENT DOCUMENTS

| | | | |
|---|---|---|---|
| 5,296,411 | 3/1994 | Gardner et al. | 437/238 |
| 5,403,786 | 4/1995 | Hori | 437/238 |
| 5,464,792 | 11/1995 | Tseng et al. | 437/160 |
| 5,605,848 | 2/1997 | Ngaoaram | 437/24 |
| 5,650,344 | 7/1997 | Ito et al. | 437/40 |
| 5,661,072 * | 8/1997 | Jeng | 438/439 |
| 5,672,521 | 9/1997 | Barsan et al. | 437/24 |
| 5,851,892 | 12/1998 | Lojek et al. | 438/305 |
| 6,001,694 * | 12/1999 | Shih et al. | 438/287 |

\* cited by examiner

*Primary Examiner*—David Nelms
*Assistant Examiner*—David Nhu
(74) *Attorney, Agent, or Firm*—George O. Saile; Stephen B. Ackerman

(57) ABSTRACT

A new method is provided for introducing nitrogen concentrations into oxide layers. The first embodiment of the invention teaches a $NO/N_2O$ pre-oxidation anneal followed by a re-oxidation followed by a $NO/N_2O/NH_3$ anneal. The second embodiment of the invention teaches the formation of a layer of sacrificial oxide, followed by a nitrogen implantation followed by the removal of the sacrificial oxide followed by the gate oxide formation followed by a $NO/N_2O/NH_3$ anneal.

26 Claims, 3 Drawing Sheets

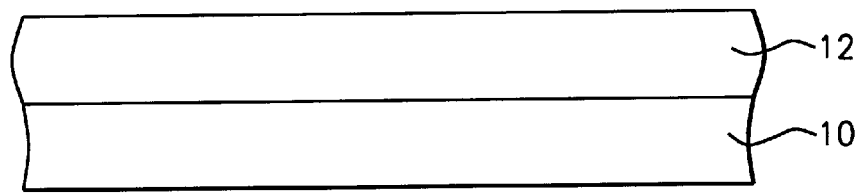
*FIG. 1 - Prior rt*
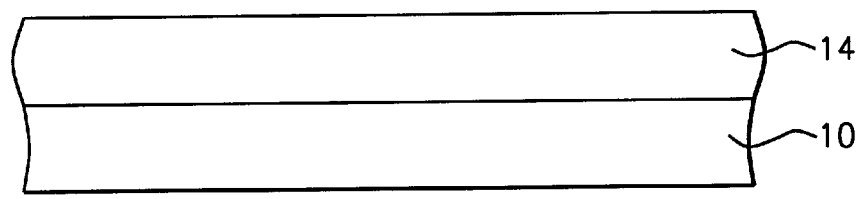
*FIG. 2 - Prior Art*
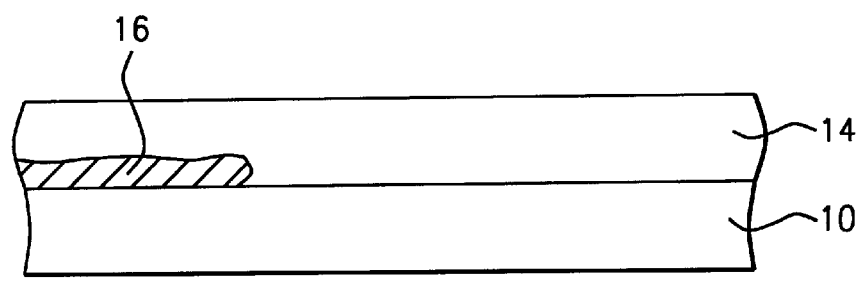
*FIG. 3 - Prior Art*

METHOD OF GENERATING TWO NITROGEN CONCENTRATION PEAK PROFILES IN GATE OXIDE

BACKGROUND OF THE INVENTION (1) Field of the Invention

The invention relates to the fabrication of integrated circuit devices, and more particularly, to a method of forming a gate oxide layer.

(2) Description of the Prior Art

In the formation of Integrated Circuits on the surface of a semiconductor substrate, a layer of silicon oxide is typically grown over the surface of a monocrystalline substrate. The formation of this layer of stoichiometric and non-stoichiometric oxide is generally well known in the art. The layer of oxide can be grown either by means of deposition or by thermal oxidation techniques. Thermal oxidation is generally preferred for areas where electrical performance is critical. In the formation of for instance MOSFET devices, a polysilicon layer is deposited over the layer of oxide and patterned to form the polysilicon gate electrode of the MOSFET device.

The creation of high quality gate oxide is of critical importance in the fabrication of semiconductor devices; gate oxide quality has a direct effect on device yield, reliability and performance. Problems such as surface roughness, layer impurity and particles can be caused by cleaning technology parameters and aspects such as concentration of the cleaning solution, chemicals used during the cleaning process, the cleaning equipment, the cleaning recipe and others. Oxidation problems can be caused by oxidation process control parameters such as time, temperature, pressure, oxidation agents or gasses used and others. Silicon wafer technology can introduce problems of initial substrate defects and impurities. Atomic flatness needs to be achieved for the surface of the substrate in order to allow the deposition of a high quality oxide layer on its surface. Well known methods are available in the art to reduce substrate micro-roughness such as the choice of the cleaning temperature, the etchant to be used and the time that is required to establish the desired substrate surface quality.

For a number of applications, such as the creation of the thin layer of tunnel oxide for Electrically Erasable Programmable Read-Only Memory (EEPROM) devices, the oxide layer is grown over heavily doped regions. These oxide layers are typically thinner (less than 100 Angstrom thick) than gate oxides (in order to readily achieve programmability of the device) and are generally considered to be of lower quality than oxides grown over lightly doped regions. The channel region of MOS devices generally is created using lightly doped regions, the gate oxide created over this region therefore tends to be of relatively high quality.

Thermally grown oxides provide good adherence between the oxide layer and the underlying silicon substrate while also providing a good mask against ion implantation used for the formation of the gate electrode source/drain regions. Irregularities in thermally grown oxide may result from irregularities on the silicon surface over which the layer of oxide is grown. Such irregularities can take on many different forms and can be classified as precipitates, dislocations, defects, contaminants, improper bonds, etc. These surface irregularities may be compounded by irregularities that occur in the created layer of oxide. The accumulation of irregularities that are further amplified during the process of the creation of the oxide layer may lead to the formation of "trap sides" where charged ions or minority carrier may accumulate.

The gate oxide forms the interface between the underlying (doped) channel regions of MOS devices and the overlying gate electrodes of the MOS transistor. Increased emphasis on smaller device dimensions leads to thinner gate oxide layers. This however places further requirements on the quality of the gate oxide layer. In the MOS transistor, the gate dielectric must support the voltage difference between the gate electrode and the substrate in an environment where ions and electrons from the gate and substrate enter the gate electrode. For very small-scale MOS devices, the effective gate length can be less than 1 micron. U.S. Pat. No. 5,464,792 teaches that, at such small gate length, electrons can be injected into the dielectric layer during periods when the transistor is switched on and off. This injection can, over time, cause a shift in the threshold voltage of the dielectric, which may effect the switching ability of the device.

Decreasing the thickness of the oxide layer leads to increasing of the electro-magnetic field that is present inside and at the boundaries of the oxide layer. This leads to the creation of hot-carriers within this field that are injected into the gate dielectric. This leads to an increase of the density of charge carriers in the interface region resulting in a shift of the electrical characteristics of the device. This leads to serious problems of deterioration of operational margins of the device. These effects are to be avoided meaning that requirements must be placed on the fabrication of the gate dielectric that result in an electrically stable interface.

From the above it is clear that functionality and reliability problems can occur in advanced Metal Oxide Semiconductor Field Effect Transistors (MOSFETs) that employ polysilicon or polycide (polysilicon/metal silicide stack) gate electrodes in contact with thin gate oxide layers. These problems are caused by the diffusion of dopant impurities and/or other impurities from the polysilicon or polycide gate electrode into and/or through the underlying thin gate oxide layer. It is, for example, known that boron and/or phosphorus dopant impurities employed in doping polysilicon can diffuse through an underlying thin gate oxide layer and diffuse into a device channel region. Fluorine impurities may also diffuse through or from the polysilicon layer of a polysilicon or polycide gate electrode and cause an apparent increase in an underlying thin gate electrode oxide layer thickness. Fluorine impurities may originate from either boron difluoride impurity doping of a polysilicon layer or from tungsten hexafluoride based CVD tungsten silicide employed in forming the upper layer of a gate electrode. This increase in thin gate oxide layer thickness may compromise the operating parameters of a MOSFET device.

From the above it is further clear the gate dielectric must not be prone to an excessive amount of charge build-up within the layer or at the dielectric to underlying substrate interface while the dielectric breakdown of the layer must be adequately high. The interface layer must exhibit good resistance to hot carrier penetration and subsequent damage while diffusion and penetration of the oxide layer by dopants and other charge carrying impurities is well understood and controlled.

U.S. Pat. No. 5,650,344 teaches that the use of re-oxidized nitride oxide material for gate oxides is a frequently applied practice. It has been shown that the use of re-oxidized nitrided gate oxides (ONO gates) provides a significant improvement in gate oxide quality with respect to gate degradation due to high field strength and radiation, further retarding boron diffusion from boron doped polysilicon gates and providing resistance against hot electrons in both p and n MOSFET devices. In addition, the high positive fixed charge at the edge of the polysilicon gates (that results from the use of ONO gates) increases the punch through voltage for p-type MOSFET.

U.S. Pat. No. 5,650,344 further teaches that these benefits have not all be derived from the use of the ONO gate but can also be attributed to the nitrogen region that forms in the substrate and in the gate oxide along their interface. The nitrogen region forms in both the substrate and in any overlying nitrided oxide material along the interface of the substrate and the overlying nitrided oxide, which may include all or part of the gate oxide. In Prior Art devices, this nitrogen region is uniform along the interface of the gate oxide and the underlying substrate and typically has nitrogen concentration levels of 10–20% by atomic weight.

U.S. Pat. No. 5,650,344 further teaches a disadvantage of the use of ONO gates and the accompanying underlying nitrogen regions. A uniform fixed-charge density region develops along the common interface and over the entire width of the gate oxide. The presence of the fixed-charge density regions under the center of the ONO gate increases electric charge scattering and thus degrades electric charge mobility between the gate oxide and the substrate.

Nitrogen concentrations must because of this effect be kept below about 4% whereby this level or slightly less of Nitrogen concentrations provides adequate protection against boron penetration from a polysilicon gate into the substrate. It is further known that a nitrogen concentration of about 10% or more is required under the periphery of the gate oxide to provide a high enough positive fixed charge density to sufficiently increase the punch-through voltage for p-type MOSFET.

Improved semiconductor devices may therefore be formed by exposing the gate electrode to a nitride environment after the polysilicon gate electrode has been formed on the surface of the substrate. The gate structure may serve as total or partial shield during this exposure, which may result in a reduction of the concentration of the re-oxidized nitrided material over the width of the gate electrode. The shielding by the gate electrode also reduces the concentration of nitride underlying the gate electrode.

FIGS. 1 through 3 shows Prior Art formation of nitrogen concentrations within an oxide layer.

FIG. 1 shows a cross section of a semiconductor substrate 10 over which a layer 12 of oxide has been deposited. The method includes oxidizing a silicon-based surface in an oxidizing atmosphere in a first temperature to form an oxidized silicon-based surface. The oxidized silicon-based surface is then heated in an inert atmosphere to a second temperature that is higher than the first temperature to anneal the oxidized silicon-based surface 14, FIG. 2. The inert atmosphere can contain NO or $N_2O$ or $NH_3$ and is any atmosphere that grows minimal oxide on or within a silicon-bases surface. While maintaining the second temperature, the inert atmosphere receives or is replaced with a nitrided oxide gas to form the nitrogen atmosphere. The nitride of the nitrided oxide gas penetrates the surface of the oxidized silicon-based surface and forms a concentration 16 of nitride that has accumulated at the interface between the annealed layer of oxide and the underlying substrate, FIG. 3. Thereafter, the oxidized silicon-based surface is cooled in the presence of both oxygen and the inert gas. The oxidizing atmosphere can contain, in addition with oxygen, also ozone, hydrogen, hydrogen peroxide, silicon dioxide or hydrogen and chlorine.

U.S. Pat. No. 5,851,892 (Lojek et al.) shows a post oxide $N_2$ anneal.

U.S. Pat. No. 5,605,848 (Ngaoaram) shows a dual N I/I process for a gate oxide.

U.S. Pat. No. 5,403,786 (Hori) discloses an oxide growth, a nitriding process and an anneal for a gate oxide.

U.S. Pat. No. 5,672,521 (Barsan et al.) shows an N I/I into the substrate to grow gate oxides of different thicknesses.

U.S. Pat. No. 5,296,411 (Gardner et al.) discloses a N2 anneal for a gate oxide.

U.S. Pat. No. 5,650,344 (Ito et al.) recites a reoxidized nitrided oxide layer.

U.S. Pat. No. 5,464,792 (Tseng et al.) shows an anneal to create N buildup in an oxide layer.

SUMMARY OF THE INVENTION

A principle objective of the invention is to create a new nitrogen concentration profile in the layer of gate oxide.

Another objective of the invention is to create a multiplicity of nitrogen concentration profiles in a multiplicity of locations in the layer of gate oxide.

Yet another objective of the invention is to improve electrical performance of the gate oxide layer A still further objective of the invention is to place a nitrogen concentration peak at the gate to underlying substrate interface.

It is yet another objective of the invention to further enhance the use of nitride oxide in the creation of high quality oxide layers.

It is a further objective of the invention to improve hot carrier degradation in the oxide layer caused by the accumulation of nitrogen at the substrate to oxide layer interface.

It is a further objective of the invention to reduce leakage current at the substrate to oxide layer interface by replacing SiO bonds with SiN bonds.

It is a further objective of the invention to prevent boron penetration from the gate electrode to the underlying channel during anneal process of PMOS devices.

It is yet a further objective of the invention to improve Time Dependent Dielectric Breakdown (TDDB) of the gate oxide dielectric layer.

In accordance with the objectives of the invention a new method is provided for introducing nitrogen concentrations into oxide layers. The first embodiment of the invention teaches a $NO/N_2O$ pre-oxidation anneal followed by a re-oxidation followed by a $NO/N_2O/NH_3$ anneal. The second embodiment of the invention teaches the formation of a layer of sacrificial oxide, followed by a nitrogen implantation followed by the removal of the sacrificial oxide followed by the gate oxide formation followed by a $NO/N_2O/NH_3$ anneal.

BRIEF DESCRIPTION OF THE DRAWINGS

FIG. 1 shows a Prior Art cross section of a semiconductor surface into which a layer of oxide has been deposited.

FIG. 2 shows a Prior Art cross-section of a semiconductor surface after anneal of the deposited oxide.

FIG. 3 shows a Prior Art cross section of a semiconductor surface with a concentration of nitrided oxide.

DESCRIPTION OF THE PREFERRED EMBODIMENTS

Figure 4:
FIG. 4 shows a cross section of a semiconductor surface after anneal of a layer of nitrided oxide on the substrate surface.

Referring now specifically to FIG. 4, there is shown a cross section of a semiconductor surface 10 after a nitride-oxide anneal of the substrate surface. The NO or $N_2O$ anneal of the substrate surface is performed under a temperature of between about 600 and 800 degrees C. for a time between about 20 and 40 seconds (used to activate the dopants) and at a pressure below about $10^{-6}$ Torr. This anneal is a pre-oxidation anneal, which creates a layer 18 of nitrided oxide over the surface of the underlying substrate 10. Layer 18 is a layer of oxide with a heavy concentration of nitride, this concentration of nitride has as yet no definitive concentration profile.

Figure 5:
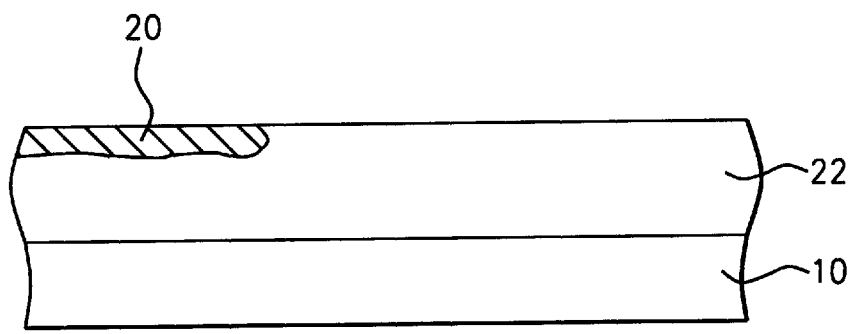
FIG. 5 shows a cross section of a semiconductor surface after re-oxidation of the annealed layer of nitrided oxide.

FIG. 5 shows a cross section of a semiconductor surface after re-oxidation of layer 18, FIG. 4, of nitrided oxide. This process of re-oxidation creates the concentration 20 of nitride within the oxide along the upper surface of the oxide layer 22.

The process of re-oxidation is similar to the process described previously under FIGS. 1 through 3, as follows. The oxidized and annealed silicon-based surface is heated in an inert atmosphere to a temperature. The inert atmosphere can contain NO or $N_2O$. While maintaining the temperature, the inert atmosphere receives or is replaced with a nitrided oxide gas to form the nitrogen atmosphere. The nitride of the nitrided oxide gas penetrates the surface of the oxidized silicon-based surface and forms a concentration 20 of nitride that accumulates at the top surface of the layer of oxide. Thereafter, the oxidized silicon-based surface is cooled in the presence of both oxygen and the inert gas.

Figure 6:
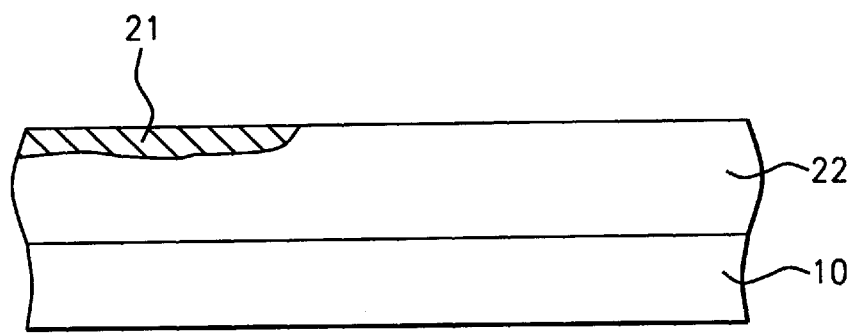
FIG. 6 shows a cross section of a semiconductor surface after anneal of the re-oxidized layer on the substrate surface.

FIG. 6 shows a cross section of a semiconductor surface after anneal of the re-oxidized layer on the substrate surface. The anneal of the oxide 22 is a NO or $N_2O$ or $NH_3$ anneal performed under a temperature of between about 600 and 800 degrees C. for a time between about 20 and 40 seconds (used to activate the dopants) and at a pressure below about $10^{-6}$ Torr. This $NO/N_2O/NH_3$ anneal creates another nitrogen concentration profile 21, FIG. 6, at the top surface of the oxide layer 22.

Figure 7:
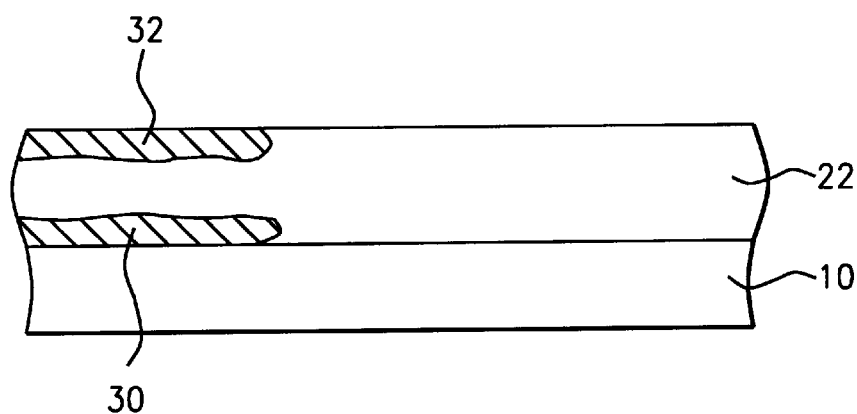
FIG. 7 shows a cross section of a semiconductor surface and profiles of two nitride concentrations within the oxide layer on the substrate surface.

FIG. 7 shows how the two previously created nitride profiles co-exist. The last created nitride profile, created during the $NO/N_2O/NH_3$ anneal (FIG. 6), forces the first created profile, created during re-oxidation (FIG. 5) further into the layer of oxide and to the surface that forms the interface between the layer of oxide and the underlying surface of the substrate. The nitride profile created during the re-oxidation process is highlighted as 30, the nitride profile created during the $NO/N_2O/NH_3$ anneal is highlighted as 32.

Figure 8:
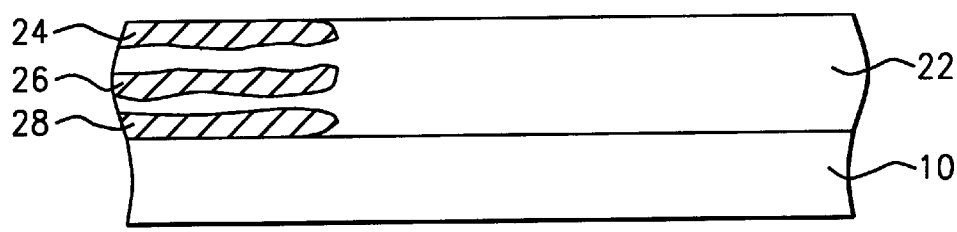
FIG. 8 shows a cross section of a semiconductor surface and profiles of three nitride concentrations within the oxide layer on the substrate surface.

By introducing the cycle of re-oxidation combined with a $NO/N_2O/NH_3$ anneal, any number of nitrogen concentrations can be created in the gate oxide layer. At the completion of the $NO/N_2O/NH_3$ anneal as shown in FIGS. 6 and 7, the cycle of re-oxidation (FIG. 5) and $NO/N_2O/NH_3$ anneal (FIG. 6) can be repeated resulting in the creation of a multiplicity of nitride concentrations in the layer of oxide. This is further highlighted in FIG. 8 where, after the completion of the processing up through FIG. 7, another step of re-oxidation and of $NO/N_2O/NH_3$ anneal has been performed. There have now been created three nitrogen profiles 24, 26 and 28 inside the layer of gate oxide. This process of creating nitrogen layers can be continued at will and in accordance with particular design parameters and requirements for the gate oxide layer.

S. Wolf, teaches, in Volume three of Silicon Processing, The Submicron MOSFET, pages 346 and 347, the occurrence of "white ribbons" during the formation of oxide layers and a typical application of a layer of "sacrificial" gate oxide. A thin layer of silicon nitride can form on the substrate surface and close to the border of the active regions, this as a result of the reaction between oxidizing species (such as $O_2$ or $H_2O$) and the silicon nitride. $H_2O$ can react with the masking nitride during the step of field oxidation thereby creating $NH_3$ or some other NH compound or nitrogen. This $NH_3$ diffuses through the oxide and reacts with the silicon substrate to form silicon-nitride spots or ribbons. When the gate oxide is subsequently grown, the growth rate becomes impeded by the presence of the silicon nitride. The most commonly used method of eliminating the white ribbons is to grow wet "sacrificial" gate oxide, typically to a thickness of between 25 and 50 um, after stripping the masking nitride and thee pad oxide. This sacrificial oxide is removed by wet etching prior to growing the final gate oxide.

The "sacrificial" gate oxide of the second embodiment of the invention is used to slow down or better control the implant of nitride ions into the substrate.

Figure 9:
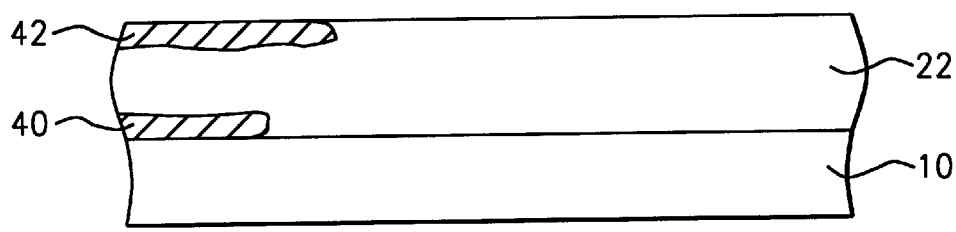
FIG. 9 shows a cross section of a semiconductor surface and profiles of two nitride concentrations under the third embodiment of the invention.

FIG. 9 addresses the second embodiment of the invention and makes use of sacrificial oxide formation. The sacrificial oxide is first created for the purposes stated above. After this step has been completed, nitrogen ions are implanted into the layer of oxide. This implant creates a region of nitrogen ions in the top region of the substrate, just below the surface of the substrate. The sacrificial layer is next removed followed by the formation of the layer 22 of gate oxide. This step of gate oxidation "pulls" the nitrogen ions from the silicon substrate into the gate oxide layer and forms in this manner the first concentration 40 of hydrogen in the gate oxide. This first concentration is located in the lower regions of the gate oxide and along the interface between the gate oxide layer and the surface of the substrate. The step of $NO/N_2O/NH_3$ anneal is performed next thereby creating the second nitride concentration 42 within the layer of gate oxide.

The nitride ($N_2$) ion implant into the oxide layer is performed at a typical energy of about 20 to 50 keV and at a dose of between about $8 \times 10^{15}$ and $1.6 \times 10^{16}$ atoms/cm$^2$.

Although the present invention is illustrated and described herein as embodied in the construction of a gate oxide layer, it is nevertheless not intended to be limited to the details as presented. Rather, various modifications may be made in the details within the scope and range of equivalents of the claims and without departing from the spirit of the invention.

What is claimed is:

1. A method for forming an oxide layer having a non-uniform concentration of nitride for a semiconductor device, whereby nitride of a nitrided oxide gas penetrates the surface of an oxidized silicon-based surface and forms a final nitride concentration in close proximity to the surface of said oxide layer overlying said silicon-based surface, comprising the steps of:

providing a silicon semiconductor substrate;

performing a pre-oxidation anneal of the surface of said semiconductor substrate, forming a nitrided oxide layer over the surface of said substrate, said nitrided oxide layer comprising an initial nitride profile in close proximity to the surface of said nitrided oxide layer;

performing a re-oxidation of said nitrided oxide layer, modifying said initial nitride profile to an intermediate nitride profile in close proximity to the surface of said nitrided oxide layer; and performing a second anneal of said oxide layer in a nitrogen containing ambient, modifying said intermediate nitride profile to a final nitride profile in close proximity to the surface of said nitrided oxide layer.

2. The method of claim 1 wherein said pre-oxidation anneal is a NO anneal performed at a temperature between about 900 and 1100 degrees C. for a duration of between about 50 and 70 seconds and at a pressure below about $10^{-6}$ Torr.

3. The method of claim 1 wherein said pre-oxidation anneal is a $N_2O$ anneal performed at a temperature between about 950 and 1150 degrees C. for a duration of between about 80 and 100 seconds and at a pressure below about $10^{-6}$ Torr.

4. The method of claim 1 wherein said re-oxidation is performed in an oxidation chamber at a temperature between about 950 and 1150 degrees C. for a time between about 50 and 70 seconds and at a pressure below about $10^{-6}$ Torr by exposing the surface of said substrate to an oxidizing atmosphere whereby said oxidizing atmosphere contains one or more of the elements from the group of oxygen, ozone, hydrogen, hydrogen peroxide, silicon dioxide or hydrogen and chlorine.

5. The method of claim 1 wherein said second anneal is performed at a temperature of between about 600 and 800 degrees C. for a time between about 20 and 40 seconds and at a pressure below about $10^{-6}$ Torr.

6. The method of claim 1 wherein said nitrogen containing ambient contains NO.

7. The method of claim 1 wherein said nitrogen containing ambient contains $N_2O$.

8. The method of claim 1 wherein said nitrogen containing ambient contains $NH_3$.

9. The method of claim 1 whereby the steps of performing a re oxidation of said oxide layer and performing a second anneal of said oxide layer are repeated a multiplicity of times, forming a multiplicity of nitride concentrations within said nitrided oxide layer, whereby said multiplicity of nitride concentrations within said nitrided oxide layer comprise a multiplicity of said final nitride concentrations that are located at adjustable depths under the surface of said nitrided oxide layer.

10. A method for forming a high quality oxide on the surface of a silicon-based semiconductor substrate, comprising the steps of:

providing a semiconductor substrate, said substrate having a silicon-based surface;

annealing said silicon-based surface at a first temperature in the presence of a first annealing agent for a time span, forming an nitrided-oxide layer over said silicon-based surface, said nitrided oxide layer comprising an initial nitride profile in close proximity to the surface of said nitrided-oxide layer;

re-oxidizing said nitrided-oxide layer over said silicon-based surface in a re-oxidizing atmosphere, modifying said initial nitride profile to an intermediate nitride profile in close proximity to the surface of said nitrided-oxide layer;

annealing said nitrided-oxide surface at a second temperature in the presence of a second annealing agent, for a time span sufficient to anneal said nitride oxide layer, modifying said intermediate nitride profile to a final nitride profile in close proximity to the surface of said nitrided-oxide layer; and cooling the oxidized, silicon based surface in the presence of both first and second annealing gasses, further consolidating said final nitride profile in close proximity to the surface of said nitrided oxide layer.

11. The method of claim 10 wherein said first temperature is between about 600 and 800 degrees C. applied for a duration of said first time span of between about 80 and 100 seconds and at a pressure below about $10^{-6}$ Torr.

12. The method of claim 10 wherein said first annealing agent contains NO.

13. The method of claim 10 wherein said first annealing agent contains $N_2O$.

14. The method of claim 10 wherein said re-oxidizing said nitrided-oxide layer is inserting said substrate into an oxidizing chamber thereby exposing said surface of said substrate to a temperature of between about 700 and 900 degrees C. for a time between about 40 and 60 seconds and to an oxidizing atmosphere whereby said oxidizing atmosphere can contain one or more of the elements from the group of oxygen, ozone, hydrogen, hydrogen peroxide, silicon dioxide or hydrogen and chlorine.

15. The method of claim 10 wherein said second temperature is between about 600 and 800 degrees C. applied for a duration of between about 80 and 100 seconds and at a pressure below about $10^{-6}$ Torr.

16. The method of claim 10 wherein said second annealing agent contains NO.

17. The method of claim 10 wherein said second annealing agent contains $N_2O$.

18. The method of claim 10 wherein said second annealing agent contains $NH_3$.

19. A method for forming a high quality oxide on the surface of a semiconductor substrate, comprising the steps of:

providing a semiconductor substrate, said substrate having a silicon-based surface;

forming a layer of sacrificial oxide over said silicon-based surface;

performing a nitrogen ion implant into said layer of sacrificial oxide, partially penetrating said layer of sacrificial oxide, partially implanting said nitride ions into said silicon-based surface;

removing said layer of sacrificial oxide from said silicon-based surface;

forming a layer of gate oxide over said silicon-based surface;

annealing said silicon-based surface at a second temperature in an annealing agent atmosphere and at a temperature sufficient to anneal layer of gate oxide creating an oxidized, silicon based surface; and cooling the oxidized, silicon based surface in the presence of the annealing agents.

20. The method of claim 19 wherein said performing a nitrogen ion implant is performed at a typical energy of about 20 to 50 keV and at a dose of between about $8 \times 10^{15}$ and $1.6 \times 10^{16}$ atoms/cm$^2$.

21. The method of claim 19 wherein said annealing agent is NO annealed at a temperature of between about 600 and 800 degrees C. for a time between about 20 and 40 seconds and at a pressure below about $10^{-6}$ Torr.

22. The method of claim 19 wherein said annealing agent is $N_2O$ annealed at a temperature of between about 600 and 800 degrees C. for a time between about 20 and 40 seconds and at a pressure below about $10^{-6}$ Torr.

23. The method of claim 19 wherein said annealing agent is $NH_3$ annealed at a temperature of between about 600 and 800 degrees C. for a time between about 20 and 40 seconds and at a pressure below about $10^{-6}$ Torr.

24. The method of claim 19 wherein said forming a layer of gate oxide is a RTO process thereby removing possible damage incurred during said nitrogen ion implant.

25. The method of claim 10 whereby the steps of performing a re-oxidation said nitrided-oxide layer and annealing said nitrided-oxide layer at a second temperature and cooling the oxidized, silicon based surface in the present of both a first and a second annealing agents are repeated a multiplicity of times, forming a multiplicity of nitride concentrations within said nitrided-oxide layer, said multiplicity of nitride concentrations within said nitrided-oxide layer comprising a multiplicity of said final nitride concentrations that are located at multiple and controllable depths under the surface of said nitrided oxide layer.

26. The method of claim 19 whereby the steps of annealing said silicon-based surface at a second temperature and cooling the oxidized, silicon based surface in the present of annealing agents are repeated a multiplicity of times, forming a multiplicity of nitride concentrations within said nitrided oxide layer, said multiplicity of nitride concentrations comprising a multiplicity of said final nitride concentrations that are located at multiple and controllable depths under the surface of said nitrided oxide layer.

* * * * *